United States Patent [19]

Gumb

[11] Patent Number: 4,638,116
[45] Date of Patent: Jan. 20, 1987

[54] MASKING OF HOLES IN CIRCUIT PATTERNS ON CIRCUIT BOARDS PRIOR TO FLOW SOLDERING

[75] Inventor: Beverley W. Gumb, London, Canada
[73] Assignee: Northern Telecom Limited, Montreal, Canada
[21] Appl. No.: 772,573
[22] Filed: Sep. 4, 1985

Related U.S. Application Data

[63] Continuation-in-part of Ser. No. 618,901, Jun. 8, 1984.

[30] Foreign Application Priority Data

Jun. 4, 1984 [CA] Canada .................................. 455752

[51] Int. Cl.$^4$ .......................... H05K 1/00; H05K 3/00
[52] U.S. Cl. .................................... 174/68.5; 29/829; 427/96; 427/154; 428/901
[58] Field of Search ...................... 339/17 E; 174/68.5; 427/96, 154; 29/825, 829; 361/397, 402; 428/901

[56] References Cited

U.S. PATENT DOCUMENTS

| | | | |
|---|---|---|---|
| 3,268,653 | 8/1966 | McNutt | 339/17 E |
| 3,567,844 | 3/1971 | Kremar | 174/68.5 |
| 3,610,811 | 10/1971 | O'Keefe | 174/68.5 |
| 4,301,189 | 11/1981 | Arai et al. | 427/96 |

Primary Examiner—Arthur T. Grimley
Assistant Examiner—Morris H. Nimmo
Attorney, Agent, or Firm—Sidney T. Jelly

[57] ABSTRACT

A circuit pattern on a circuit board usually has a number of contact areas to which components are soldered. Some of the contact areas have holes extending through the board for insertion of leads of leaded components, the leads then being flow soldered to the contact areas. It often occurs that additional leaded components are to be mounted on the board after a first flow soldering step. However, holes through which the leads are to pass can be closed by solder. These holes are therefore masked mechanically, by a masking member which contacts the board at these holes, or by tape, or other such method. The present invention uses a conventional solder resist layer, usually applied prior to flow soldering, extending the solder resist layer over a part of the contact area to the periphery of the hole, the hole having an unplated bore or wall. The resist layer extends for at least part of the hole periphery. This prevents the solder being attached to the contact area at the masked periphery and the hole is not closed by a film of solder.

4 Claims, 3 Drawing Figures

MASKING OF HOLES IN CIRCUIT PATTERNS ON CIRCUIT BOARDS PRIOR TO FLOW SOLDERING

This application is a continuation-in-part of application Ser. No. 618,901 filed June 8, 1984.

This invention relates to the masking of holes in circuit patterns or circuit boards, and is particularly concerned with the prevention of blocking of holes not occupied by component leads, during flow soldering, to permit the insertion of further component leads after soldering.

It often occurs that after some components have been mounted on a circuit board, as by insertion of leads through holes in the circuit pattern, followed by flow or wave soldering, additional components are to be mounted on the circuit board, with leads being pushed through further holes in the circuit pattern. However, if the circuit board is passed through the process of flow or wave soldering after mounting of the first components, then unoccupied holes become closed by a layer of solder extending across each hole. This effectively prevents the insertion of leads through these holes at a later stage.

One way of preventing the blocking of holes is to position a mask over the circuit board, the mask having projections which rest on the areas around and over the holes so as to prevent the solder reaching the holes. Another way is to apply tape over the holes before soldering. Both of these methods are inconvenient and increase the cost of a circuit board.

The present invention makes use of a conventional solder resist which is usually applied to circuit boards prior to soldering so that solder is only applied to those areas where it is required. These areas include contact areas around holes where component leads are already inserted, contact areas on the circuit pattern where components may be surface mounted or where conductors will be attached at a later stage, and areas around holes where leads of components will be inserted and soldered at a later stage. By causing the solder resist to extend to and extend around part of the circumference of a hole, blockage of the hole is prevented, but solder will still be applied around the remainder of the circumference of the hole, for eventual soldering of a component lead.

The invention is extremely simple, but completely effective. As solder resist is normally applied to circuit boards prior to the flow soldering, no extra step is needed, or extra apparatus. There is, to a practical extent, no cost increase in the resist.

The invention will be readily understood by the following description of an embodiment, by way of example, in conjunction with the accompanying drawings, in which.

Figure 1:
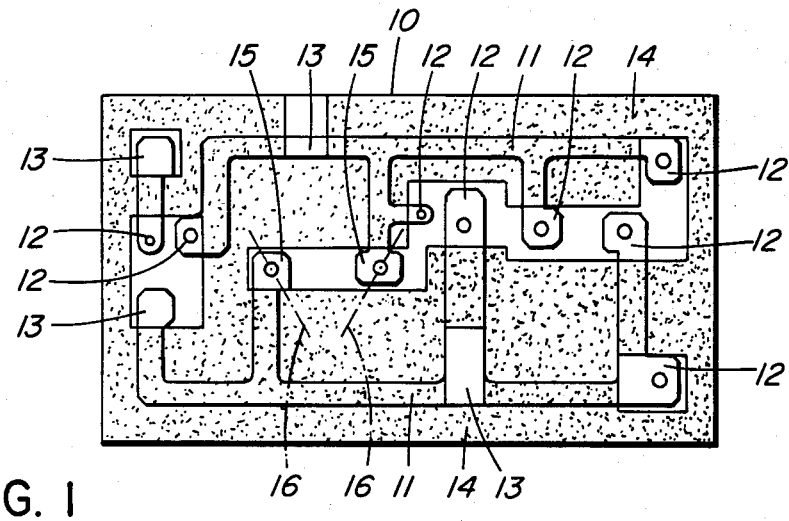
FIG. 1 is a plan view of a circuit board.

FIG. 1 illustrates very diagrammatically a circuit board 10 having a circuit pattern 11 thereon. Various portions of the circuit pattern are covered with a solder resist. Generally, the solder resist extends over all of the circuit board, leaving only those areas clear onto which solder is to adhere. The circuit pattern is generally of copper. Certain contact areas with holes are shown at 12 and contact areas to which contact is made as by surface mounting or by conductors, and without holes, are shown at 13. The area of solder resist is shown by cross-hatching.

It can be assumed for the purposes of the present description that components are to be mounted on the circuit board, on the other surface to that seen in FIG. 1, with leads passing the holes in the contact areas 12. The ends of the leads are clinched or bent over and then the circuit board soldered, by the application of a liquid solder, referred to as flow or wave soldering. Solder will be applied to the contact areas 12, soldering the leads of the components to the contact areas. Solder will also be applied to the contact areas 13, carrying out what can be termed a "tinning" step or operation, which will facilitate the later soldering of conductors or contact members to such contact areas.

Also shown in FIG. 1 are two contact areas with holes, indicated at 15, the holes having unplated bores or walls. It is to be assumed that initially no component will be mounted on the circuit board with leads extending through the holes at areas 15. However, a component will be mounted at a later stage and leads inserted through the holes. With the situation as illustrated in FIG. 1, the areas 15 will be "tinned" or covered with solder during the flow soldering step with the almost certain blocking of the holes by a thin solder layer. However, if the solder resist 14 is extended over a part of an area 15 to extend for part of the circumference of the hole, solder will not extend over the hole and block it. The proposed edge of the solder resist is indicated by lines 16. It is not of importance which part of the circumference of the holes is contacted by the solder resist, and the particular arrangement can be selected to suit the particular layout. Thus, in FIG. 1, the left hand area 15 could have the lower left corner covered by solder resist, extending to the line 16. For the right hand area 15 in FIG. 1, either the lower right corner or upper left corner could be covered, to the line 16, or alternatively the upper right corner could be covered. The essential feature is that a part of the periphery of the hole should have the solder resist extend up to it. That part of a contact area 15 not covered by solder resist would still have solder on it after soldering and thus be acceptable for the soldering of component leads thereto.

Figure 2:
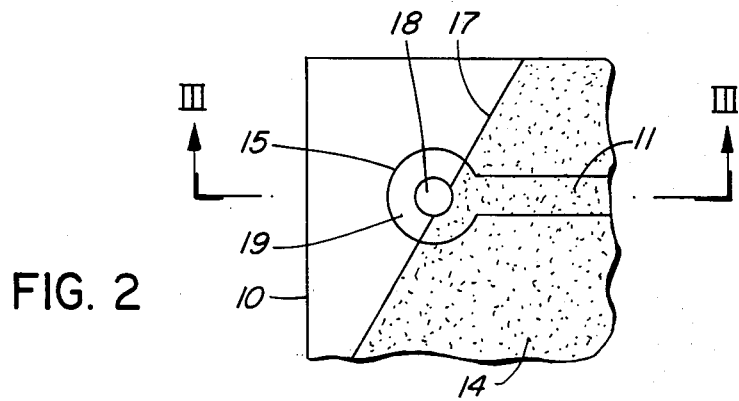
FIG. 2 is an enlarged view of a hole in a circuit pattern, illustrating the masking.
Figure 3:
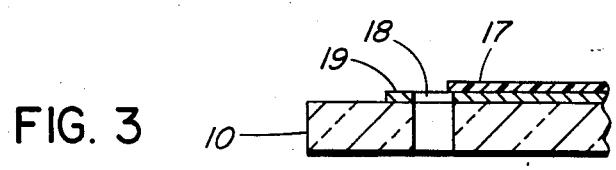
FIG. 3 is a cross-section on the line III—111 of FIG. 2.

FIG. 2 illustrates to a slightly larger scale the situation for a contact area with the use of the present invention. In this example, the contact area 15 is circular but the actual shape is not of relevance. In FIG. 2, the edge of the solder resist 14, indicated at 17, extends over the contact area 15 and around the periphery of the hole 18. As seen in FIG. 3, the hole 18 extends through the circuit board, and contact area 15. The hole 18 is not plated through, the wall of the hole being the base material of the circuit board. The solder resist is seen at 14. In this particular example, the solder resist extends round slightly less than half of the periphery of the hole 18. After flow soldering, solder will be present on that part of the contact area 15 not covered by solder resist, indicated at 19. While normally approximately half of the periphery of the hole has soldering resist round it, the actual portion of the hole periphery having solder resist can vary. The presence of solder resist at the hole periphery prevents attachment of liquid solder during the soldering cycle, and the surface tension of the solder prevents the solder from forming a film or layer for only part of the hole. It is therefore necessary to have the solder resist extend for only a sufficient part of the hole periphery that the liquid solder will not be capable of forming and maintaining a complete film or layer. If unable to attach itself to the hole periphery it will move back and extend only around that part of the hole which has no solder resist. The actual portion of the hole diameter contacted by the solder resist can be a relatively small fraction. Also, it is possible to have the solder resist extend up to the hole periphery in more than one place. Thus two or more, separate, spaced portions of the hole periphery can be contacted by the solder resist. It is also envisaged, though not so convenient, that the solder resist extend only at the hole periphery as a narrow annular or part annular band, leaving the rest of the contact area radially outward from the band of solder resist uncovered.

What is claimed is:

1. A circuit board having a circuit pattern on a surface thereof, said circuit pattern including at least one contact area, a hole extending through said contact area and said circuit board, said hole having a constant diameter through the contact area and the circuit board, the hole having an unplated periphery in the circuit board, and a layer of solder resist extending over said circuit pattern, said layer extending over part of said contact area and for part of the periphery of the hole.

2. A circuit board as claimed in claim 1, said layer extending for substantially half of the periphery of the hole.

3. A method for preventing the closing of an unoccupied hole in a circuit board, said circuit board including a circuit pattern on a surface thereof, said circuit pattern including a plurality of contact areas and said hole extending through one of said contact areas and said circuit board, said hole having a constant diameter through the contact area and circuit board and having an unplated periphery in the circuit board, comprising applying a layer of solder resist over said circuit pattern, the solder resist extending over part of said one of said contact areas and extending for part of the periphery of the hole.

4. A method as claimed in claim 3, including applying the solder resist to form an edge extending across the contact area and around the periphery of the hole for approximately half the periphery of the hole.

* * * * *